United States Patent [19]
Miura et al.

[11] Patent Number: 6,027,669
[45] Date of Patent: Feb. 22, 2000

[54] POLISHING COMPOSITION

[75] Inventors: Shirou Miura; Atsunori Kawamura; Kazusei Tamai, all of Aichi, Japan

[73] Assignee: Fujimi Incorporated, Nishikasugai-gun, Japan

[21] Appl. No.: 08/985,909

[22] Filed: Dec. 5, 1997

[30] Foreign Application Priority Data

| Dec. 5, 1996 | [JP] | Japan | 8-325614 |
| Dec. 5, 1996 | [JP] | Japan | 8-325616 |
| Dec. 5, 1996 | [JP] | Japan | 8-325618 |
| Dec. 5, 1996 | [JP] | Japan | 8-325619 |

[51] Int. Cl.$^7$ .............................. H01B 1/04; C09D 1/00
[52] U.S. Cl. .................. 252/518.1; 106/636; 106/286.7; 106/3; 427/331
[58] Field of Search ................ 252/500, 518.1, 252/79.5; 106/3, 600, 636, 286.7; 216/99; 427/331

[56] References Cited

U.S. PATENT DOCUMENTS

| 5,244,534 | 9/1993 | Yu et al. | 156/636 |
| 5,352,277 | 10/1994 | Sasaki | 106/6 |
| 5,376,222 | 12/1994 | Miyajima et al. | 156/636 |
| 5,575,837 | 11/1996 | Kodama et al. | 106/3 |

FOREIGN PATENT DOCUMENTS 0 520 109   12/1992   European Pat. Off. .

OTHER PUBLICATIONS

Database WPI, Derwent Publications, AN 94–005184, SU 1 781 270, Dec. 15, 1992.
Database WPI, Derwent Publications, AN 82–54236E, SU 859 406, Aug. 30, 1981.
Database WPI, Derwent Publications, AN 83–51359K, SU 943 264, Jul. 15, 1982.
Database WPI, Derwent Publications, AN 75–59846W, SU 457 712, Mar. 11, 1975.
Patent Abstracts of Japan, vol. 96, No. 8, Aug. 30, 1996, JP 8–107094, Apr. 23, 1996.
Patent Abstracts of Japan, vol. 18, No. 477 (E–1602), Sep. 6, 1994, JP 6–163490, Jun. 10, 1994.
Patent Abstracts of Japan, vol. 97, No. 2, Feb. 28, 1997, JP 8–267356, Oct. 15, 1996.

*Primary Examiner*—Mark Kopec
*Attorney, Agent, or Firm*—Oblon, Spivak, McClelland, Maier & Neustadt, P.C.

[57] ABSTRACT

A polishing composition comprising fumed silica, a basic potassium compound and water, of which the specific electric conductivity is from 100 to 5,500 $\mu$S/cm.

10 Claims, No Drawings

POLISHING COMPOSITION

The present invention relates to a polishing composition useful for polishing semiconductors, photomasks, various substrates for memory hard disks and various industrial products such as synthetic resins, or parts thereof. Particularly, it relates to a polishing composition suitable for use for planarization polishing of the surface of device wafers in the semiconductor industries. More particularly, the present invention relates to a polishing composition which provides a high efficiency and is capable of forming an excellent polished surface in polishing silicon dioxide as an interlayer dielectric, to which a CMP technique (described in detail below) has heretofore been applied, and particularly to a polishing composition wherein a rate of polishing a silicon dioxide film is less deteriorated even when recycled for use, and which is excellent in processing stability.

The progress in so-called high technology products including computers has been remarkable in recent years, and with respect to parts such as ULSI to be used for such products, there has been a continuous progress for high density and high speed year by year. Accordingly, in the design rule for semiconductor devices, narrowing of wirings has progressed year by year, so that the depth of focus in a process for producing devices has become shallow and the requirement for flatness of the pattern-forming surface has become severe.

Further, to cope with an increase of the wiring resistance due to narrowing of wirings, stacking of devices is carried out to shorten the wiring length, but the step height of the formed pattern surface has been problematic as a hindrance against stacking.

Accordingly, to carry out such narrowing and stacking, it is necessary to carry out planarization of the desired surface to remove the step height in the process. For the planarization, spin on glass, resist etch back or other planarization methods have heretofore been employed.

However, by such conventional methods, it is difficult to attain global planarization (complete planarization) which is required for advanced devices, although partial planarization is possible. Accordingly, a chemical mechanical polishing (hereinafter referred to simply as "CMP") for planarization has now been studied, which is a combination of mechanical or physical polishing and chemical polishing.

Not limited to this CMP, but in various types of polishing of semiconductor wafers, an attention is paid to a metal contamination, particularly inclusion of sodium in a polishing composition. This is because the electric characteristics as a semiconductor will be thereby changed unless the metal contamination is completely removed in a clearing process after the polishing process. Therefore, it is required that a polishing composition is highly pure, and necessarily that its starting materials are also highly pure.

Because of such a background, fumed silica is often used as an abrasive particle to be used for a polishing composition of semiconductor wafers. Among silica used as the abrasive particle, fumed silica has characteristics that it is easier to obtain highly pure silica, and that the rate of polishing a silicon dioxide film to be polished is higher than other silica, e.g. colloidal silica. Accordingly, in a conventional CMP process, it has been common to use a polishing composition having potassium hydroxide, ammonia and others added to the base material of fumed silica and water.

However, there is a problem that a cost of the CMP process is high. The reasons are that the CMP process is complicated, that a substantial investment for equipments is accordingly necessary, that consumption goods used in the CMP process, including a polishing composition, are expensive, and the like. Also, with regard to the above polishing composition containing fumed silica, fumed silica is comparatively expensive, and therefore, a study is carried out to reduce the costs from various aspects.

As one of them, it has been considered to recycle a polishing composition used in the CMP process. However, when the polishing composition was recycled for use, there was a problem that the polishing rate of the polishing composition which polished a surface to be polished, e.g. a silicon dioxide film, gradually decreased as the polishing composition was repeatedly used, and that the process was therefore not stable.

To solve this problem, the present inventors have conducted an extensive study and, as a result, have found that by adding a basic potassium compound to a polishing composition containing fumed silica and water to bring its specific electric conductivity to from 100 to 5,500 $\mu$S/cm or by adding a nitrogen-containing basic compound thereto to bring its specific electric conductivity to from 100 to 1,500 $\mu$S/cm, when the polishing composition is recycled for use, the decrease in the rate of polishing a surface to be polished, e.g. a silicon dioxide film, can be suppressed, and that the process can be stabilized. The present inventors have found also that by bringing the specific electric conductivity to from 30 to 5,000 $\mu$S/cm with regard to a polishing composition containing colloidal silica and water or by adding further a nitrogen-containing compound thereto to bring its specific electric conductivity to from 30 to 1,500 $\mu$S/cm, when the polishing composition is recycled for use, the same effect as above can be obtained.

The above conventional polishing composition containing fumed silica or colloidal silica contains large amounts of compounds probably for the purpose of increasing its polishing rate. Therefore, it has a specific electric conductivity larger than that of the polishing composition of the present invention. Whereas, it is surprising that the polishing composition of the present invention having a particular specific electric conductivity does not substantially lose the polishing rate, and even when it is recycled for use, the decrease in the polishing rate is small.

The present invention is intended to provide a polishing composition which has characteristics that it is highly pure, that the rate of polishing a silicon dioxide film to be polished is high, that an excellent polished surface is obtained and that other basic polishing characteristics are not impaired, which characteristics have been desired for a polishing composition used in a CMP process, particularly a polishing composition wherein when the polishing composition is recycled for use, the decrease in the rate of polishing the surface to be polished is small even when repeatedly used, so that the process can be stabilized.

The first mode of the polishing composition of the present invention is a polishing composition comprising fumed silica, a basic potassium compound and water, which has a specific electric conductivity of from 100 to 5,500 $\mu$S/cm. The second mode is a polishing composition comprising fumed silica, a nitrogen-containing basic compound and water, which has a specific electric conductivity of from 100 to 1,500 $\mu$S/cm. The third mode of the polishing composition of the present invention is a polishing composition comprising colloidal silica and water, which has a specific electric conductivity of from 30 to 5,000 $\mu$S/cm. The fourth mode is a polishing composition comprising colloidal silica, a nitrogen-containing basic compound and water, which has a specific electric conductivity of from 30 to 1,500 $\mu$S/cm.

The polishing composition of the present invention has a high rate of polishing the surface to be polished. Further, when it is recycled for use, the decrease in the rate of polishing the surface to be polished when repeatedly used, is smaller than a conventional polishing composition having a high specific electric conductivity, so that the process can be stabilized.

Fumed silica/colloidal silica

The polishing composition of the present invention contains fumed silica or colloidal silica as the main abrasive particle.

The fumed silica of the present invention is produced by pyrolyzing at a high temperature (including combustion) a precursor which can be pyrolyzed to provide silicon oxide, such as a halogenide, particularly a chloride. For example, the fumed silica is produced by combustion of silicon tetrachloride and hydrogen in air. The reaction formula is as follows.

$$SiCl_4 + 2H_2 + O_2 \rightarrow SiO_2 + 4HCl$$

A particle of this fumed silica generally has a shape of a secondary particle having a chain structure wherein a few or a few tens fine primary particles are gathered. Such fumed silica is available on the market, for example, with a trade name Aerosil by Japan Aerosil Corporation.

On the other hand, the colloidal silica for the purpose of the present invention is water colloidal silica or gel, which includes all stable dispersions of amorphous silica in fluids. As a method for producing such colloidal silica, there are a wet process, a silica gel peptization method, an ion-exchanging method, a hydrolysis method of an organic silicon compound and others. However, a method for producing the colloidal silica of the present invention is not particularly limited unless the effects of the present invention are impaired. It is preferred that the colloidal silica used in the present invention contains metal as little as possible. This may be achieved by lowering the metal content by the producing method or by purification by means of ion-exchanging treatment or the like.

The fumed silica or the colloidal silica used in the present invention polishes the surface to be polished by a mechanical function as abrasive particles. The average particle size of the fumed silica in terms of a sphere calculated from the specific surface area measured by a BET method, is usually from 5 to 80 nm, preferably from 10 to 65 nm. The average particle size of the colloidal silica in terms of a sphere calculated from the specific surface area measured by a BET method, is usually from 5 to 200 nm, preferably from 10 to 150 nm. If the average particle size of the fumed silica exceeds 80 nm, or if the average particle size of the colloidal silica exceeds 200 nm, a problem that the surface polished becomes rough or scratched, sometimes occurs. On the other hand, if the average particle size of the fumed silica or the colloidal silica is less than 5 nm, the polishing rate becomes remarkably low, such is not practical.

The content of the fumed silica used in the present invention is usually from 0.1 to 50% by weight, preferably from 1 to 25% by weight based on the total amount of the polishing composition. The content of the colloidal silica used in the present invention is usually from 0.05 to 50% by weight, preferably from 0.1 to 30% by weight based on the total amount of the polishing composition. If the content of the fumed silica or the colloidal silica is too small, the polishing rate becomes low, such is not practical. On the other hand, if it is too large, homogeneous dispersion can not be maintained, and the viscosity of the composition becomes so large that it sometimes becomes difficult to handle it.

Water

Water used in the present invention may be industrial water, city water, ion-exchange water, distilled water, pure water, extrapure water or the like, and is not particularly limited unless it impairs the effects of the present invention. The content of water in the polishing composition of the present invention is usually from 49.5 to 99.89% by weight, preferably from 74.6 to 98.9% by weight, based on the total amount of the polishing composition containing fumed silica, a basic potassium compound and water, and is usually from 49 to 99.89% by weight, preferably from 74.5 to 98.9% by weight, based on the total amount of the polishing composition containing fumed silica, a nitrogen-containing basic compound and water. It is usually from 48.5 to 99.95% by weight based on the total amount of the polishing composition containing colloidal silica and water, and is usually from 45 to 99.94% by weight, preferably from 65 to 99.89% by weight, based on the total amount of the polishing composition containing colloidal silica, a nitrogen-containing basic compound and water.

Basic potassium compound/nitrogen-containing basic compound

The basic potassium compound or the nitrogen-containing basic compound used for the polishing composition of the present invention accelerates polishing of a surface to be polished by a chemical action. The basic potassium compound or the nitrogen-containing basic compound also acts as a dispersant for fumed silica or colloidal silica which is the main abrasive particle.

As the basic potassium compound to be used in the present invention together with fumed silica, or if necessary, together with colloidal silica, any basic potassium compound may be used unless it impairs the effects of the present invention. A desired basic potassium compound is a hydroxide, a phosphate, a pyrophosphate, a phosphite, a carbonate, a silicate, a borate, a hypochlorite, a hypobromite or a carboxylate such as a gluconate, a lactate, a citrate, a tartarate, a malate, a glycolate, a malonate, a formate or an oxalate, and it is preferably a salt of a weak acid.

The content of the basic potassium compound in the polishing composition is, when used together with fumed silica, usually from 0.01 to 0.5% by weight, preferably from 0.1 to 0.4% by weight, based on the total amount of the polishing composition. When used together with colloidal silica, it is preferably at most 1.5% by weight based on the total amount of the polishing composition.

The nitrogen-containing basic compound to be used in the present invention together with fumed silica or colloidal silica, includes an ammonium compound, an amine compound and others, and any nitrogen-containing basic compound may be used unless it impairs the effects of the present invention. Ammonia is a typical one. Specifically, a desired nitrogen-containing basic compound is, when used together with fumed silica, an ammonium hydroxide, an ammonium phosphate, an ammonium carbonate, an ammonium silicate, an ammonium borate, an ammonium hypochlorite, an ammonium hypobromite or an amine compound, and it is preferably an ammonium salt of a weak acid. When used together with colloidal silica, it is an ammonium hydroxide, an ammonium phosphate, an ammonium carbonate, an ammonium silicate, an ammonium borate, an ammonium hypochlorite, an ammonium hypobromite, an ammonium carboxylate such as an ammonium gluconate, an ammonium malonate, an ammonium formate or ammonium oxalate, or an amine compound, and it is preferably an ammonium salt of a weak acid.

The content of the nitrogen-containing basic compound in the polishing composition is, when used together with fumed silica, usually from 0.01 to 1% by weight, preferably from 0.1 to 0.5% by weight, based on the total amount of the polishing composition. When used together with colloidal silica, it is preferably from 0.01 to 5% by weight. If the content of the nitrogen-containing basic compound is too small, the polishing rate becomes remarkably low. On the other hand, if it is too large, when recycled for use, the initial rate of polishing a silicon dioxide film tends to become a little higher, but the polishing rate becomes remarkably low when repeatedly used.

Polishing composition

The polishing composition of the present invention is usually prepared by mixing and dispersing or dissolving the above components, i.e. fumed silica and a basic potassium compound or a nitrogen-containing basic compound, or colloidal silica and if necessary a basic potassium compound or a nitrogen-containing basic compound, into water in predetermined amounts. The order for dispersing or dissolving the above components or various additives to be added if necessary (which will be described in detail below), is not particularly limited. For example, fumed silica or colloidal silica may be dispersed, and a basic potassium compound or a nitrogen-containing basic compound may be dissolved thereinto, or into an aqueous solution wherein a basic potassium compound or a nitrogen-containing basic compound is dissolved, fumed silica or colloidal silica may be dispersed. Further, fumed silica or colloidal silica, and the basic potassium compound or the nitrogen-containing basic compound may be mixed into water at the same time and dispersed and/or dissolved at the same time.

The polishing composition of the present invention contains the basic potassium compound or the nitrogen-containing basic compound, but the basic potassium compound or the nitrogen-containing basic compound may be obtained in the polishing composition. Namely, a neutral or acidic potassium salt such as potassium chloride or potassium nitrate, or a neutral or acidic nitrogen-containing salt such as ammonium chloride or ammonium nitrate, and a basic compound such as sodium hydroxide may be used at the same time to obtain the same state as a state wherein the basic potassium compound or the nitrogen-containing basic compound is added to the polishing composition. However, in this method, the specific electric conductivity which is described below, becomes too large, or excessive ions exist, which causes a problem of impurities. Accordingly, it is usual that the basic potassium compound or the nitrogen-containing basic compound is directly used.

The method for dispersion or dissolution is optional. For example, the dispersion or dissolution is carried out by stirring with an agitator or by ultrasonic dispersion.

Further, for the preparation of the polishing composition, various known additives may be incorporated for the purpose of maintaining or stabilizing the quality of the product or as required depending upon the type of the object to be treated, the treating conditions and other polishing requirements.

Preferred examples of such further additives include (a) when fumed silica is used as an abrasive particle, silicon dioxides other than fumed silica, such as colloidal silica and precipitated silica, or when colloidal silica is used as an abrasive particle, silicon dioxides other than colloidal silica, such as fumed silica and precipitated silica, (b) celluloses such as cellulose, carboxymethylcellulose and hydroxyethylcellulose, (c) water-soluble alcohols such as ethanol, propanol and ethylene glycol, (d) surfactants such as sodium alkylbenzene sulfonate and a condensate of formalin with naphthalene sulfonic acid, (e) organic polyanion substances such as a lignin sulfonate and a polyacrylate, (f) inorganic salts such as ammonium sulfate, magnesium chloride, potassium acetate and aluminum nitrate, (g) water-soluble polymers (emulsifiers) such as polyvinyl alcohol, (h) aluminum oxides such as alumina sol and fumed alumina, (i) zirconium oxides such as fumed zirconia, and (j) titanium oxides such as fumed titania and others.

The polishing composition of the present invention is prepared as described above. Its specific electric conductivity is from 100 to 5,500 $\mu$S/cm, preferably from 500 to 4,000 $\mu$S/cm, when fumed silica, the basic potassium compound and water are contained. It is from 100 to 1,500 $\mu$S/cm, preferably from 300 to 1,200 $\mu$S/cm, when fumed silica, the nitrogen-containing basic compound and water are contained. It is from 30 to 5,000 $\mu$S/cm, preferably from 50 to 4,000 $\mu$S/cm, when colloidal silica and water are contained. It is from 30 to 1,500 $\mu$S/cm, preferably from 50 to 1,200 $\mu$S/cm, when colloidal silica, a nitrogen-containing basic compound and water are contained.

If the specific electric conductivity of the polishing composition is less than 100 $\mu$S/cm when fumed silica is used as an abrasive particle, or is less than 30 $\mu$S/cm when colloidal silica is used, it is difficult to disperse fumed silica sufficiently. On the other hand, if it exceeds 5,500 $\mu$S/cm with a composition containing fumed silica, a basic potassium compound and water, exceeds 5,000 $\mu$S/cm with a composition containing colloidal silica and water, or exceeds 1,500 $\mu$S/cm with a composition containing fumed silica or colloidal silica, a nitrogen-containing basic compound and water, the polishing rate becomes remarkably low when the polishing composition is recycled for use repeatedly.

The polishing composition of the present invention will usually have a pH of at least 7 so that it contains the basic compound stably.

The polishing composition of the present invention may be prepared in the form of a stock solution having a relatively high concentration, which may be stored or transported and which may be diluted for use at the time of actual polishing operation. The above-mentioned preferred ranges of concentration are those for actual polishing operation. Accordingly, when the composition is stored or transported in the form of a stock solution, such a stock solution is prepared to have a higher concentration.

The polishing composition of the present invention as described above is highly pure, and an excellent polished surface can thereby be obtained. Accordingly, it is useful for polishing semiconductor devices, photomasks, various substrates for memory hard disks, synthetic resins and others. When the polishing composition of the present invention is recycled for use, even though it is repeatedly used, the decrease in the rate of polishing a silicon dioxide film can be suppressed, and it is excellent in stability of processing. Accordingly, the polishing composition of the present invention is suitable for a CMP processing technique of device wafers in the semiconductor industry.

Now, the polishing composition of the present invention will be described in further detail with reference to Examples. However, it should be understood that the present invention is by no means restricted to the specific constructions of the following Examples.

Preparation of polishing compositions

Firstly, as an abrasive particle, fumed silica (tradename; Aerosil 50, mean primary particle size: 55 nm, manufactured by Japan Aerosil Corporation) was dispersed in water by an agitator to obtain a slurry having an abrasive particle concentration of 12 wt %. Further, colloidal silica (mean particle size: 0.035 μm) was likewise dispersed in water to obtain a slurry having an abrasive particle concentration of 20 wt %. Then, to these slurries, a basic potassium compound or a nitrogen-containing basic compound was added and mixed in an amount as identified in Table 1, to obtain samples of Examples 1 to 12 and Comparative Examples 1 to 11. A basic potassium compound was not added to the sample of Example 9.

Measurement of specific electric conductivity

After preparing the compositions, with respect to the respective sample of Examples 1 to 12 and Comparative Examples 1 to 11, the specific electric conductivities were measured under the same conditions. The results thus obtained are shown in Table 1.

Polishing tests

Then, polishing tests were carried out by means of the samples of Examples 1 to 12 and Comparative Examples 1 to 11.

As the object to be polished, a substrate of 6 inch silicon wafer (outer diameter: about 150 mm) having a silicon dioxide film formed by a thermal oxidation method, was used. The silicon dioxide film surface was polished.

Polishing and recycling of the polishing composition were carried out by the following methods.

Firstly, a wafer provided with a silicon dioxide film was mounted on a polishing machine, and was polished for 3 minutes under the following conditions.

Then, the wafer was removed from the polishing machine, and the polishing pad was washed with pure water for 1 minute by using a dressing material. The polishing composition which was used for polishing, was collected and filtrated sequentially with a filter having an opening of sieve of 10 μm and a filter having an opening of sieve of 5 μm by using a pump, to be used for subsequent polishing.

The above series of operations was counted as 1 set, and 6 sets of the series of operations were repeatedly carried out.

Polishing conditions

Polishing machine: single side polishing machine (diameter of the polishing table: 570 mm)
Table of polishing machine: laminated polishing pad made of polyurethane (IC-1000/Suba400 manufactured by Rodel Co. (USA))
Polishing pressure: 490 g/cm$^2$
Rotational speed of polishing table: 35 rpm
Feed rate of polishing composition: 150 cc/minute After the polishing, the wafer was sequentially cleared and dried, whereupon the reduction in the film thickness of each wafer by polishing was measured with respect to 60 samples, and the polishing rate was obtained.

Further, the deterioration ratio of the rate of polishing the silicon dioxide film was obtained by dividing the polishing rate at the sixth set by the polishing rate at the first set. The results thus obtained are shown in Table 1.

TABLE 1

| | Polishing agent | Additive | Amount added (g/l) | Specific electric conductivity (μS/cm) | Polishing rate (nm/min) | | | | | | Rate keeping ratio (%) |
|---|---|---|---|---|---|---|---|---|---|---|---|
| | | | | | 1st | 2nd | 3rd | 4th | 5th | 6th | |
| Comparative Example | | | | | | | | | | | |
| 1 | Fumed silica | Potassium hydroxide | 6 | 5800 | 181 | 180 | 175 | 172 | 170 | 166 | 91.7 |
| 2 | Fumed silica | Potassium pyrophosphate | 6 | 7500 | 140 | 137 | 135 | 134 | 131 | 128 | 91.4 |
| 3 | Fumed silica | Potassium carbonate | 6 | 8200 | 149 | 148 | 143 | 140 | 139 | 136 | 91.2 |
| 4 | Fumed silica | Ammonia | 15 | 2500 | 160 | 155 | 157 | 155 | 153 | 147 | 91.9 |
| 5 | Fumed silica | Piperazine | 50 | 2000 | 28 | 28 | 26 | 25 | 26 | 25 | 89.3 |
| 6 | Colloidal silica | Potassium hydroxide | 20 | 7000 | 115 | 115 | 112 | 110 | 108 | 105 | 91.3 |
| 7 | Colloidal silica | Potassium pyrophosphate | 20 | 14000 | 89 | 87 | 86 | 83 | 83 | 81 | 91.0 |
| 8 | Colloidal silica | Potassium carbonate | 20 | 12500 | 90 | 89 | 87 | 85 | 83 | 82 | 91.1 |
| 9 | Colloidal silica | Ammonia | 60 | 3200 | 120 | 119 | 116 | 113 | 111 | 110 | 91.7 |
| 10 | Colloidal silica | Ethylene diamine | 60 | 2700 | 85 | 83 | 80 | 81 | 80 | 78 | 91.8 |
| 11 | Colloidal silica | Triammonium phosphate | 60 | 43000 | 85 | 85 | 82 | 82 | 80 | 77 | 90.6 |
| Example | | | | | | | | | | | |
| 1 | Fumed silica | Potassium hydroxide | 3 | 3500 | 176 | 176 | 172 | 174 | 172 | 172 | 97.7 |
| 2 | Fumed silica | Potassium pyrophosphate | 3 | 3200 | 137 | 137 | 136 | 135 | 135 | 134 | 97.8 |
| 3 | Fumed silica | Potassium carbonate | 3 | 3200 | 145 | 143 | 143 | 141 | 142 | 141 | 97.2 |
| 4 | Fumed silica | Ammonia | 3 | 1200 | 154 | 153 | 152 | 152 | 151 | 151 | 98.1 |
| 5 | Fumed silica | Piperazine | 3 | 300 | 22 | 23 | 23 | 22 | 22 | 22 | 100.0 |
| 6 | Colloidal | Potassium | 10 | 2050 | 112 | 113 | 114 | 113 | 113 | 112 | 100.0 |

TABLE 1-continued

|   | Polishing agent | Additive | Amount added (g/l) | Specific electric conductivity (μS/cm) | Polishing rate (nm/min) | | | | | | Rate keeping ratio (%) |
|---|---|---|---|---|---|---|---|---|---|---|---|
|   |   |   |   |   | 1st | 2nd | 3rd | 4th | 5th | 6th |   |
|   | silica | hydroxide |   |   |   |   |   |   |   |   |   |
| 7 | Colloidal silica | Potassium pyrophosphate | 4.5 | 4000 | 87 | 87 | 86 | 86 | 86 | 86 | 97.7 |
| 8 | Colloidal silica | Potassium carbonate | 6 | 4000 | 88 | 87 | 87 | 86 | 86 | 86 | 97.7 |
| 9 | Colloidal silica | (None) | 0 | 80 | 70 | 70 | 70 | 70 | 70 | 70 | 100.0 |
| 10 | Colloidal silica | Ammonia | 5 | 1400 | 100 | 100 | 100 | 99 | 100 | 99 | 99.0 |
| 11 | Colloidal silica | Ethylene diamine | 5 | 760 | 80 | 80 | 80 | 80 | 80 | 80 | 100.0 |
| 12 | Colloidal silica | Triammonium phosphate | 1 | 1080 | 80 | 79 | 80 | 80 | 79 | 79 | 98.8 |

From the results in Table 1, it is evident that the polishing composition of the present invention has a polishing rate which is not substantially deteriorated as compared with a conventional polishing composition having a large specific electric conductivity, and that even when it is recycled for use, the decrease in the polishing rate is less than the polishing composition having a large specific electric conductivity, and a stable polishing rate is obtainable.

Further, none of wafers used in these tests had surface defects such as scratches, and there was no particular problem in the state of the polished surface.

As described in the foregoing, the polishing composition of the present invention has a polishing rate which decreases little even when recycled for use repeatedly, and it can keep the high polishing rate at the initial stage of the recycling stably, so that the process can be stabilized.

We claim:

1. A polishing composition, comprising fumed silica, a basic potassium compound and water, having a specific electric conductivity of from 100 to 5,500 μS/cm, wherein said fumed silica has a mean primary particle size of from 5 to 80 um.

2. The polishing composition according to claim 1, wherein the basic potassium compound is selected from the group consisting of a hydroxide, a phosphate, a pyrophosphate, a phosphite, a carbonate, a silicate, a borate, a hypochlorite, a hypobromite and a carboxylate.

3. The polishing composition according to claim 1, wherein, based on the total amount of the polishing composition, the basic potassium compound is in an amount of from 0.01 to 0.5 wt %.

4. The polishing composition according to claim 1 wherein the fumed silica has a mean primary particle size of from 10 to 65 nm.

5. The polishing composition according to claim 1, wherein the fumed silica is present in an amount of from 0.1 to 50% by weight based upon the total weight of the composition.

6. The polishing composition according to claim 5, wherein the silica is present in an amount of from 1 to 25% by weight.

7. The polishing composition according to claim 1, wherein the water is present in a amount of from 49.5 to 99.89% by weight based upon the total weight of the composition.

8. The polishing composition according to claim 7, wherein the water is present in an amount of from 74.6 to 98.9% by weight.

9. The polishing composition according to claim 1, wherein, based on the total amount of the polishing composition, the basic potassium compound is in an amount of at most 1.5 wt %.

10. A method for polishing a silicon dioxide film, which comprises polishing said film with the polishing composition of claim 1.

* * * * *

UNITED STATES PATENT AND TRADEMARK OFFICE
CERTIFICATE OF CORRECTION

PATENT NO. : 6,027,669
DATED : February 22, 2000
INVENTOR(S) : Shirou MIURA, ET AL.

It is certified that error appears in the above-identified patent and that said Letters Patent is hereby corrected as shown below:

Column 9, line 42 "5 to 80 um" should be --5 to 80 nm--.

Signed and Sealed this

Twenty-second Day of May, 2001

Attest:

NICHOLAS P. GODICI

Attesting Officer  Acting Director of the United States Patent and Trademark Office